United States Patent
Mayuzumi et al.

(10) Patent No.: US 7,934,312 B2
(45) Date of Patent: May 3, 2011

(54) PRODUCTION METHOD OF AN ELECTRONIC CIRCUIT DEVICE

(75) Inventors: Takuya Mayuzumi, Hitachinaka (JP); Masahiro Sasaki, Hitachinaka (JP); Kiyoomi Kadoya, Hitachinaka (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 12/350,992

(22) Filed: Jan. 9, 2009

(65) Prior Publication Data

US 2009/0119913 A1    May 14, 2009

Related U.S. Application Data

(62) Division of application No. 11/199,177, filed on Aug. 9, 2005, now Pat. No. 7,514,784.

(30) Foreign Application Priority Data

Dec. 16, 2004    (JP) .................................. 2004-364824

(51) Int. Cl.
*H05K 3/30*    (2006.01)
(52) U.S. Cl. ........ 29/841; 29/856; 264/272.14; 439/349
(58) Field of Classification Search ............ 29/584–857; 174/260, 358, 370; 264/272.14; 257/678; 361/736, 737; 439/271, 349
See application file for complete search history.

(56) References Cited

U.S. PATENT DOCUMENTS

| | | | |
|---|---|---|---|
| 2,761,111 A * | 8/1956 | Klostermann | 439/349 |
| 4,466,680 A | 8/1984 | Sakai et al. | |
| 5,510,959 A * | 4/1996 | Derstine et al. | 174/370 |
| 5,577,937 A | 11/1996 | Itoh et al. | |
| 5,909,915 A | 6/1999 | Okuda | |
| 5,923,084 A | 7/1999 | Inoue et al. | |
| 5,966,291 A | 10/1999 | Baumel et al. | |
| 6,285,551 B1 | 9/2001 | Brandenburg et al. | |
| 6,590,777 B2 * | 7/2003 | Morino et al. | 361/736 |
| 7,134,194 B2 | 11/2006 | Brandenburg et al. | |
| 2003/0057277 A1 | 3/2003 | Kimura et al. | |
| 2003/0188883 A1 | 10/2003 | Yano et al. | |
| 2005/0105281 A1 | 5/2005 | Brandenburg et al. | |
| 2006/0012034 A1 | 1/2006 | Kadoya et al. | |

FOREIGN PATENT DOCUMENTS

| | | |
|---|---|---|
| DE | 20319173 U1 | 4/2004 |
| EP | 1487246 A1 | 12/2004 |
| JP | 2003-321247 | 11/2002 |
| JP | 2004-111435 | 4/2004 |

* cited by examiner

*Primary Examiner* — Donghai D. Nguyen
(74) *Attorney, Agent, or Firm* — Crowell & Moring LLP

(57) ABSTRACT

An electronic circuit device comprises: a printed circuit board mounted with electronic components; a resin-molded portion formed of resin so disposed that the electronic components are covered therewith; a convex connector that has metal terminals for connection and is exposed from the resin-molded portion; and a sealing member wrapped around the resin-molded portion.

7 Claims, 9 Drawing Sheets

PRODUCTION METHOD OF AN ELECTRONIC CIRCUIT DEVICE

CROSS REFERENCE TO RELATED APPLICATIONS

This application is a divisional of U.S. application No. 11/199,177, filed Aug. 9, 2005, issued as U.S. Pat. No. 7,514,784, which claims priority from Japanese application Ser. No. 2004-364824, filed on Dec. 16, 2004, the content of which is hereby incorporated by reference into this application.

FIELD OF THE INVENTION

The present invention relates to an electronic circuit device having a printed circuit board. More particularly, it relates to an electronic circuit device favorably used in various modules for use in automobiles, motorcycles, agricultural machines, industrial machines, shipboard machines, and the like.

RELATED ART

With respect to automobiles, motorcycles, agricultural machines, machining tools, shipboard machines, and the like, modular electronic circuit devices are used. Such modular electronic circuit devices include engine control modules, motor control modules, and automatic shift control modules. These modules are disposed in vehicle compartments or engine rooms. These modules typically adopt such a construction that a printed circuit board mounting electronic components is fixed on a metal base and they are covered with a cover or a casing.

Recently, a method in which an electronic control unit for an automobile is installed directly on an intake manifold or the like, that is, on-engine method has been proposed. Since the heat resistance of electronic control units using printed circuit boards is 120° C. or so, the on-engine method cannot be adopted. Electronic control units using ceramic boards are high in heat resistance, and thus can adopt the on-engine method; however, they are rather expensive. The on-engine electronic control units need not only high heat resistance, but also need vibration resistance, complete air-tightness and water-tightness better than those of the units installed in the vehicle compartment or the engine room. These requirements are imposed on not only the on-engine electronic control units but also the on-engine sensor modules, such as pressure sensor modules and air flow meter modules.

Japanese Patent Laid-Open No. 2004-111435 discloses an example of an electronic control circuit device using a printed circuit board, which can adopt the on-engine method. The electronic control circuit device according to the patent document is formed integrally by transfer molding a connector and a printed wiring board.
Patent Document 1: Japanese Patent Laid-Open No. 2004-111435

When a board is resin-molded by the transfer molding technique, flow properties of resin must be ensured to prevent the voids and the occurrence of deformation in the board. Especially, if there are many restrictions on the stereo structure of a component to be resin-molded, the physical properties, etc of the resin, the productivity lowers. In case where a resin-molded structure is adopted, the cost of structural parts can be reduced, but the cost-ratio of the connector is increased.

If an attempt is made to enhance functions with a conventional connector structure, the number of connector pins increases, and the dimensions of the connector will increase. Therefore, it is difficult to meet conflicting demands, function enhancement and downsizing.

SUMMARY OF THE INVENTION

An object of the present invention is to provide an electronic circuit device that allows downsizing and cost reduction with reliability.

According to the present invention, an electronic circuit device comprises: a circuit board mounting an electronic component; a resin-molded portion formed of resin for covering the electronic component are covered therewith; a convex connector that has a metal terminal for connection and is exposed from the resin-molded portion; and a sealing member wrapped around the resin-molded portion.

BRIEF DESCRIPTION OF THE DRAWINGS

FIG. 13 is an enlarged sectional view of the end of the sixth example of the electronic circuit device according to the present invention, as viewed head-on.

DESCRIPTION OF THE PREFERRED EMBODIMENTS

According to the present invention, an electronic circuit device that allows downsizing and cost reduction with high reliability.

Figure 1:
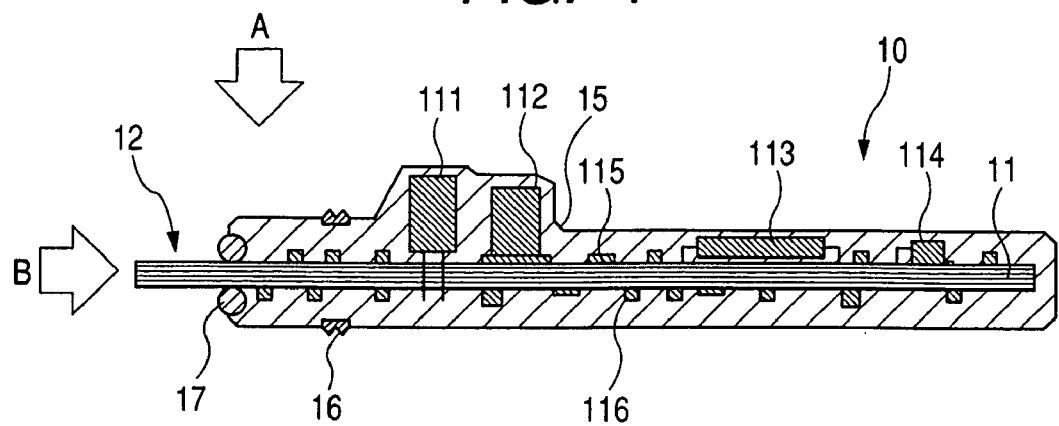
FIG. 1 is a drawing illustrating a first example of an electronic circuit device according to the present invention.

Description will be given to a first example of an electronic circuit device of the present invention with reference to FIG. 1 to FIG. 4. As illustrated in FIG. 1, the electronic circuit device 10 in this example comprises a circuit board 11, a convex connector 12, a resin-molded portion 15, and a sealing member 16. The circuit board 11 is mounted with electronic components, such as a board insert type electronic component 111, a surface mount large electronic component 112, an IC 113, a high heat producing electronic component 114, a surface mount chip-type electronic component 115, a back mount chip-type electronic component 116, and the like. These electronic components 111 to 116 are covered with the single resin-molded portion 15. Thus, the electronic circuit device 10 in this example is of resin mold type.

For the material of the resin-molded portion 15, thermosetting resins may be used. For example, an epoxy resin for transfer mold that is used in common for semiconductor encapsulation may be used. If there is a great difference in coefficient of thermal expansion between the circuit board 11 and the resin-molded portion 15, a problem results: the electronic circuit device 10 is deformed by thermal stress, and may be broken in some cases. Therefore, it is desirable that the thermal expansion coefficient of a resin used for the resin-molded portion 15 should be close to the thermal expansion coefficient of the main material of the circuit board 11 as much as possible. For the circuit board 11, a printed circuit board made mostly from epoxy resin may be used. In this case, an epoxy resin for transfer molding, a thermal expansion coefficient of the resin being 8 to $18 \times 10^{-6}$/K, is suitable for the material of the resin-molded portion 15.

A major application of epoxy resins for transfer molding is semiconductor encapsulation, and it is usually used for products smaller than the electronic circuit device 10 in this example. Therefore, many epoxy resins for transfer molding are short in a spiral flow, which is a distance by which a resin can flow from time when it is heated during resin molding to time when it is hardened under heating. Consequently, when an epoxy resin for transfer mold is used for the material of the resin-molded portion 15, it is required to select one whose spiral flow is equal to or longer than the size of the electronic circuit device 10.

Figure 2:
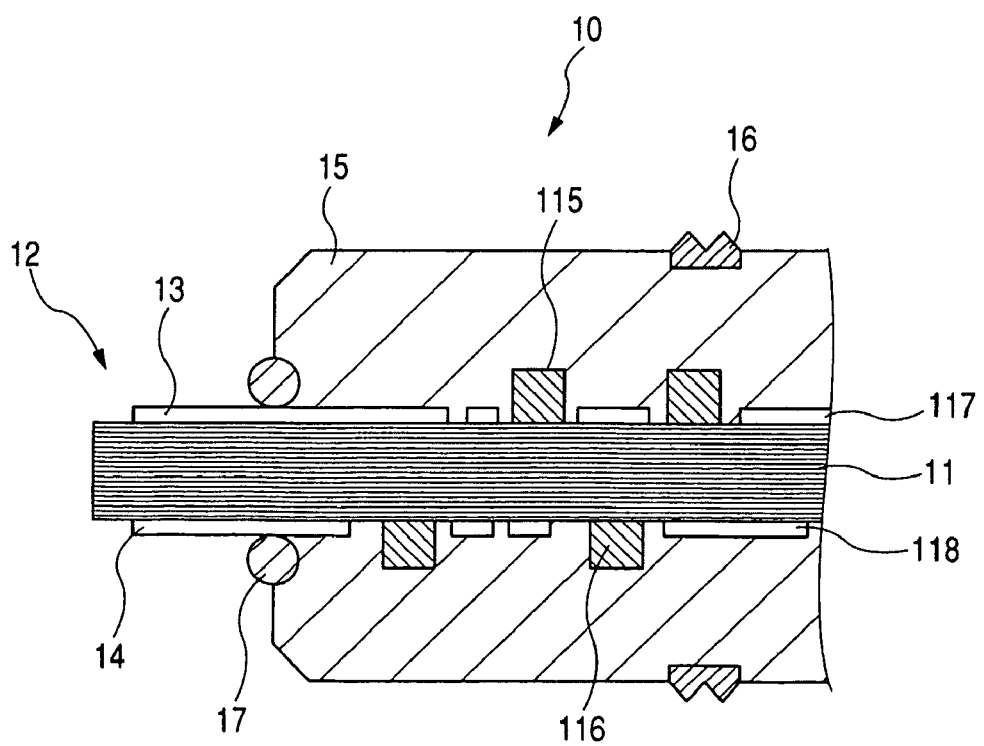
FIG. 2 is an enlarged sectional view from the direction A in FIG. 1 of the electronic circuit device according to the present invention.

FIG. 2 is an enlarged cross sectional view of an end of the electronic circuit device 10 illustrated in FIG. 1. The convex connector 12 is formed by extending the circuit board 11. That is, the convex connector 12 is formed simultaneously with the circuit board 11 in the production process of the circuit board 11. Therefore, the convex connector 12 is formed of the same material as that of the circuit board 11.

The upper face and lower face of the convex connector 12 are respectively provided with metal terminals 13 and 14 for connection. These metal terminals 13 and 14 for connection are formed by extending metal wirings 117 formed on the front face of the circuit board 11 and metal wirings 118 formed on its back face. That is, the metal terminals 13 and 14 for connection of the convex connector 12 are formed simultaneously with the metal wirings 117 and 118 of the circuit board 11 in the production process of the circuit board 11.

The sealing member 16 is formed along the periphery of the resin-molded portion 15, in proximity to the convex connector 12. A groove for receiving the sealing member 16 is formed along the periphery of the resin-molded portion 15. When the convex connector 12 is connected with a concave connector, the sealing member 16 provides a waterproof construction for the joint. The sealing member 16 may be formed of any material as long as it is an elastic material having heat resistance, oil resistance, resistance to chemicals, and the like. For example, it may be formed of rubber, resin, or the like.

In the example illustrated in the figure, the sectional shape of the sealing member 16 includes two crests and one trough. A construction having at least two crests and at least one trough is desirable. Constructing the sealing member having the sectional shape including two crests brings the following advantage. When the convex connector 12 is connected with a concave connector, the crests of the sealing member are easily deformed. Therefore, the force required for inserting/withdrawing the convex connector 12 is reduced, and the workability in installing the electronic circuit device 10 can be enhanced. The sections of the sealing member 16 may be in any other shape as long as a sufficient waterproofing function can be provided.

The O-ring 17 provided at the base of the convex connector 12 is used to prevent resin from leaking to the convex connector 12 when the circuit board 11 is encapsulated with the resin. This will be described later.

Figure 3:
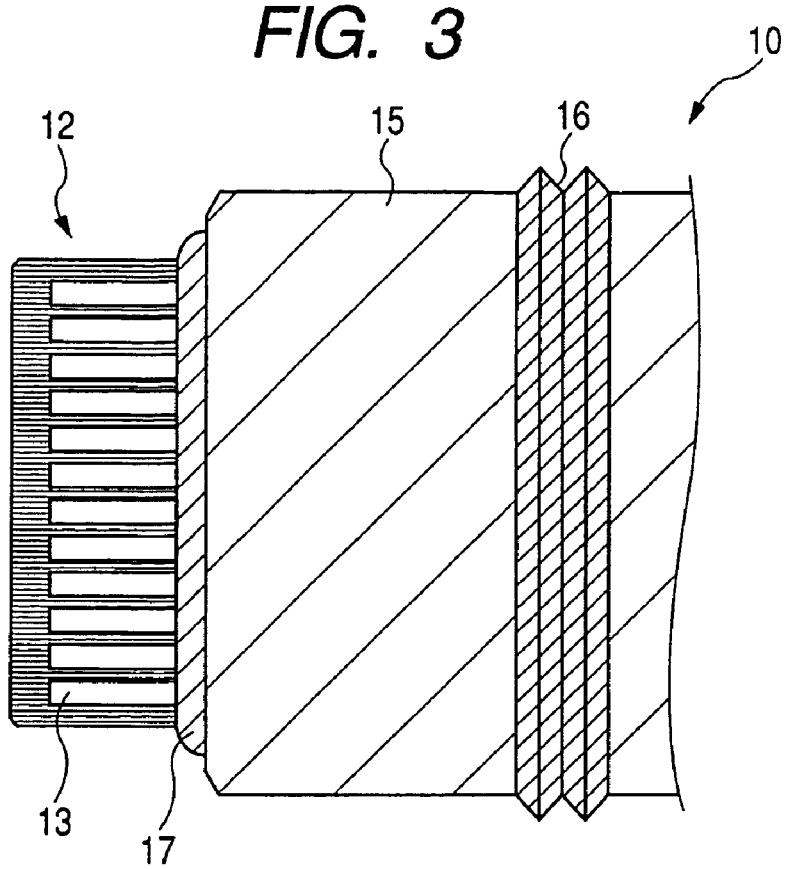
FIG. 3 is an enlarged view of the convex connector of the electronic circuit device according to the present invention as viewed from above.
Figure 4:
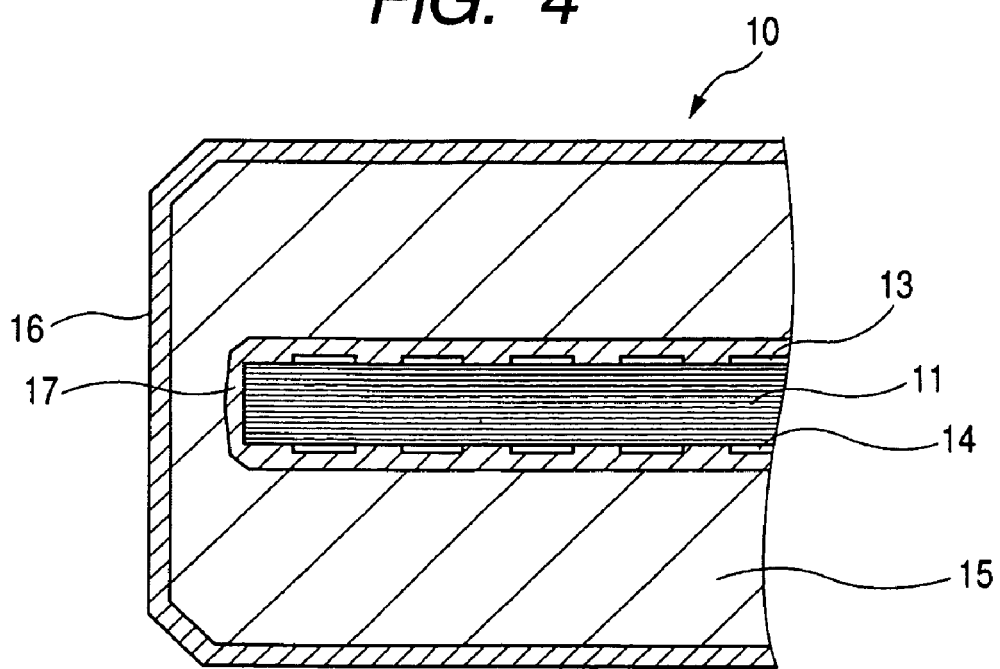
FIG. 4 is an enlarged view of the convex connector of the electronic circuit device according to the present invention as viewed from the left.

FIG. 3 is an enlarged view of the convex connector 12 in FIG. 1 as viewed from above A, and FIG. 4 is an enlarged view of the convex connector 12 in FIG. 1 as viewed from left B.

In this example, the metal terminals 13 and 14 for connection of the convex connector 12 are a plurality of strips so formed that they are arranged in parallel with one another at equal intervals. However, any other configuration may be adopted. As illustrated in FIG. 4, the metal terminals 13 for connection on the upper face and the metal terminals 14 for connection on the lower face are identical in shape with each other. Therefore, both are symmetrical with each other. In this example, the metal terminals 13 and 14 for connection are formed on both faces of the convex connector 12. Instead, the metal terminals for connection may be provided on one face. The metal terminals 13 for connection only on the upper face and the metal terminals 14 for connection on the lower face may be disposed in a staggered configuration as long as they are identical in dimensions with each other.

In the example illustrated in FIGS. 1 to 4, the convex connector 12 is provided on one side of the circuit board 11. Instead, the convex connector may be provided on two opposite sides, on three sides, or on all the four sides. If the convex connector 12 is provided on a plurality of sides, the sealing member 16 is provided in correspondence with each of the convex connectors 12.

Figure 5:
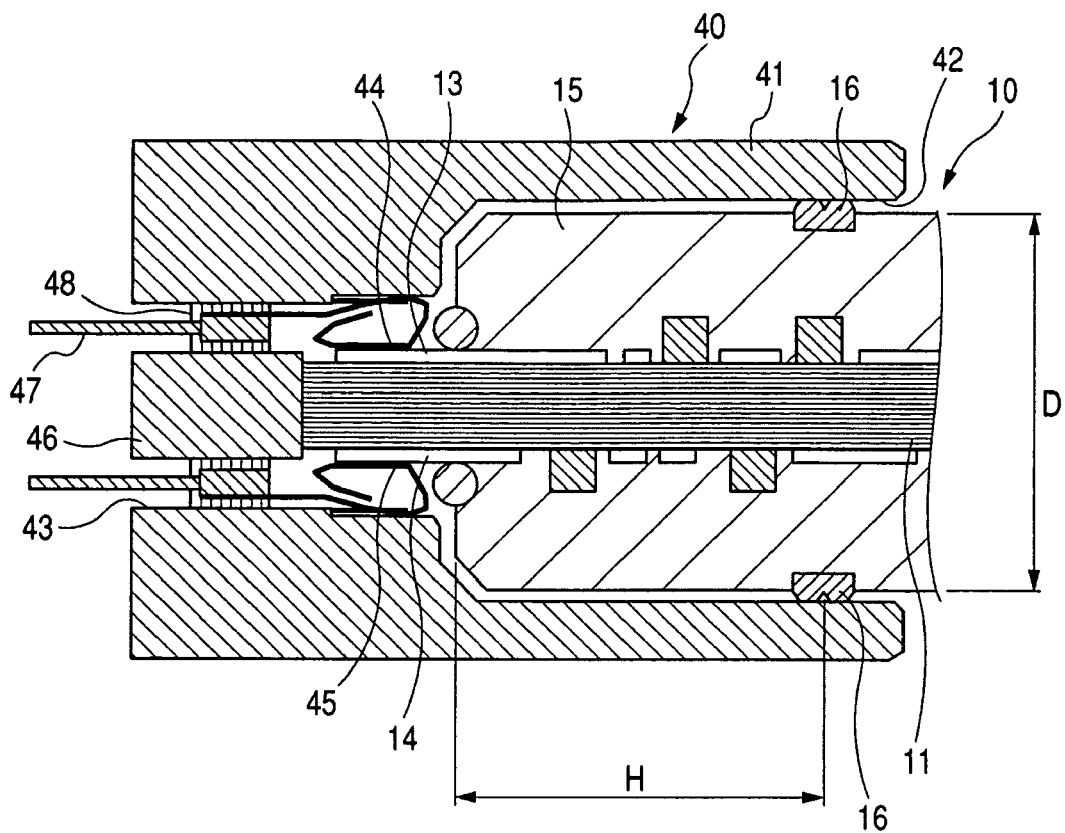
FIG. 5 is a drawing illustrating the convex connector of the first example of the electronic circuit device according to the present invention, connected with a concave connector.

FIG. 5 illustrates the convex connector 12 of the electronic circuit device 10 in FIG. 1 as is connected with a concave connector 40. The concave connector 40 has a concave portion 42 formed in its housing 41, and a hole 43 is formed in the bottom of the concave portion 42. In this hole 43, metal terminals 44 and 45 for connection and a receiving member 46 are provided. The metal terminals 44 and 45 for connection have spring constructions formed by folding strip-shaped metal plates. The metal terminals 44 and 45 for connection are connected with harnesses 47. Watertight plugs 48 are installed around the harnesses 47 for connection.

When the convex connector 12 of the electronic circuit device 10 is inserted into the concave portion 42 of the housing 41, the following takes place: the end of the convex connector 12 goes into between two metal terminals 44 and 45 for connection. As a result, the metal terminals 44 and 45 for connection are brought into contact with the metal terminals 13 and 14 for connection of the convex connector 12. When the convex connector 12 of the electronic circuit device 10 is further inserted into the concave portion 42 of the housing 41, the following takes place: the convex connector 12 is a butted against the receiving member 46, and thus the electronic circuit device 10 cannot be further pushed inward.

The sealing member 16 of the electronic circuit device 10 is pressed against the inner wall of the concave portion 42 of the housing 41, and is deformed there. As a result, the concave portion 42 of the housing 41 is sealed from the outside, and water, oil, dust, and the like are prevented from entering the concave portion from the outside.

It is desirable that the position in which the sealing member 16 is brought into contact with the concave portion 42 of the housing 41 should be far away from the metal terminals 13 and 14 for connection as much as possible. Thus, the stress produced between the electronic circuit device 10 and the concave connector 40, due to pinching force, vibration, or the like can be absorbed by the sealing member 16, not by the metal terminals for connection.

As illustrated in the figure, the width of the electronic circuit device 10 will be let to be D, and the distance between the end of the resin-molded portion 15 of the electronic circuit device 10 and the sealing member 16 will be let to be H. At this time, it is desirable that H should be substantially twice D.

The construction of the convex connector 12 of the electronic circuit device 10 and the concave connector 40 may be the same as the PCI slot construction used in common for expansion boards for personal computers. However, it is desirable that the metal terminals 44 and 45 for connection of the concave connector 40 should be of spring construction as in the example illustrated in the figure. Thus, the metal terminals 44 and 45 for connection of the concave connector 40 are pressed against the metal terminals 13 and 14 for connection of the convex connector 12. As a result, both are brought into contact with each other with reliability. The metal terminals 44 and 45 for connection of the concave connector 40 may be of any construction other than spring construction. In this case, however, it is desirable that their shape should be the same as or close to that of the metal terminals 13 and 14 for connection of the convex connector 12.

The electronic circuit device 10 in this example adopts a combination of the following constructions: the construction in which the electronic components on the circuit board 11 are resin-molded; and the slot construction used in common for expansion boards for personal computers. Thus, the electronic circuit device for use in automobiles, agricultural machines, industrial machines, shipboard machines, and the like can be constructed without impairing the following: the water tightness, reliability, and low-cost properties of conventional electronic circuit devices 10.

Description will be given to a method for resin-molding the electronic circuit device 10 with reference to FIG. 6 and FIG. 7. First, the O-ring 17 is wrapped around the base portion of the convex connector 12 of the circuit board 11 mounted with electronic components. Next, the circuit board 11 is sandwiched between two molds 61 and 62.

The cavity 63 formed between the two molds comprises a first portion 63A corresponding to the exterior shape of the resin-molded portion 15 and a second portion 63B in which the convex connector 12 is laced. The second portion 63B is larger than the outer dimensions of the convex connector 12 so that the convex connector 12 will not be brought into contact with the inner walls of the molds. The O-ring 17 is disposed at the entrance to the second portion 63B.

When the resin is injected into the cavity 63 through a resin injection portion 64, the resin is guided to the first portion 63A, but the O-ring 17 prevents it from entering the second portion 63B.

In this example, the above-mentioned use of the O-ring 17 prevents resin from being applied to the metal terminals for connection of the convex connector 12. Thus, the convex connector 12 exposed from the resin-molded portion 15 can be formed as illustrated in FIG. 1. If the O-ring is not used, the second portion 63B of the cavity 63 must be so constructed that it has the same shape as the outside shape of the convex connector 12. More specific description will be given. The molds 61 and 62 are brought into direct contact with the convex connector 12, and thus resin is prevented from being applied to the metal terminals for connection of the convex connector 12. However, if the molds 61 and 62 are brought into direct contact with the convex connector 12, problems arise: there is the possibility that the metal terminals for connection are damaged, and the molds must be fabricated with high accuracy.

The O-ring 17 is used when the resin-molded portion 15 is formed, and is unnecessary when the finished electronic circuit device 10 is used. When the electronic circuit device 10 is in use, the O-ring 17 is disposed in the waterproofed enclosed space as illustrated in FIG. 1. Therefore, the O-ring 17 need not be provided with water resistance, and further need not be provided with oil resistance, resistance to chemicals, heat resistance, vibration resistance, and the like. As a result, a very inexpensive material can be selected.

Projections 65 are formed on the inner surfaces of the molds 61 and 62, and as a result, a projection 65 is formed throughout the inner circumferential surface of the cavity 63. A groove for housing the sealing member 16 is formed throughout the circumference of the resin-molded portion 15 by this projection 65.

Figure 6:
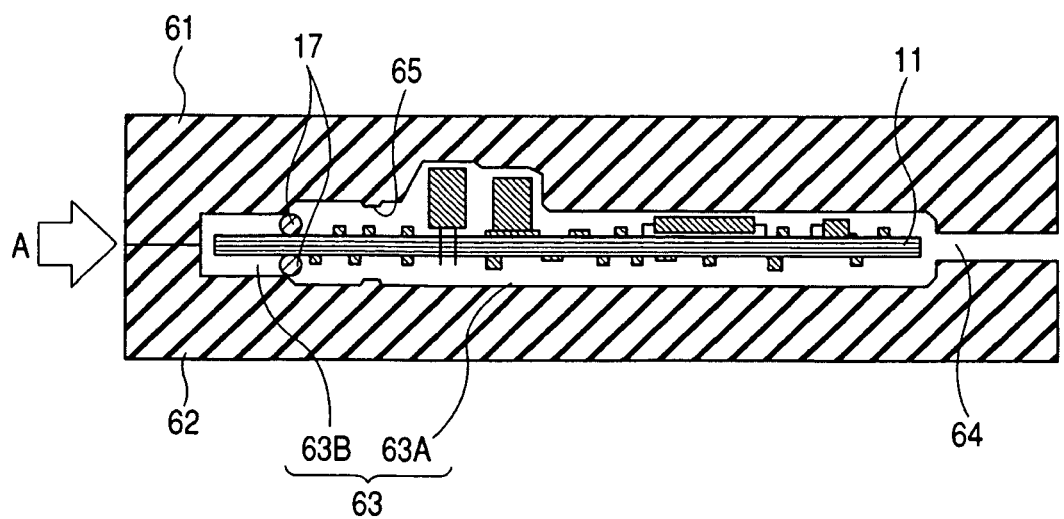
FIG. 6 is a drawing explaining a resin molding method for the electronic circuit device according to the present invention.
Figure 7:
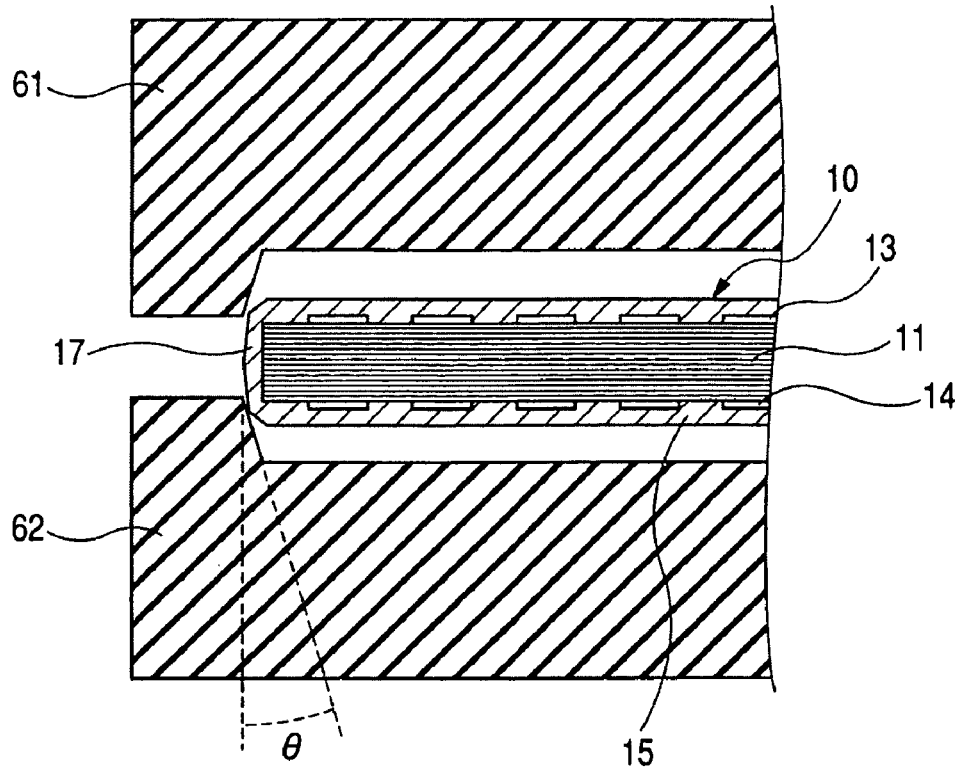
FIG. 7 is a sectional view of a circuit board placed in the cavity between the two molds in FIG. 6, as viewed from the direction of arrow A.

FIG. 7 is a sectional view of the circuit board 11 placed in the cavity 63 between the two molds as viewed from the direction of arrow A of FIG. 6. When the circuit board 11 wrapped with the O-ring 17 is sandwiched between the two molds 61 and 62, the O-ring 17 is brought into contact with an end of the second portion 63B of the cavity 63. As a result, it can be broken. If the O-ring 17 is broken, its sealing function does not work, which result in the entry of resin into the second portion of the cavity 63.

The following measure illustrated in FIG. 7 is effective in avoiding this: the areas of the second portion 63B of the cavity 63 with which areas the O-ring 17 is to be brought into contact are provided beforehand with a clearance angle θ.

With reference to FIG. 6 and FIG. 7, description has been given to a production method for an electronic circuit device 10 provided on one side with a convex connector 12. Where an electronic circuit device 10 with a convex connector 12 provided on two, three, or four sides is produced, the following measures must be taken: the molds are provided with a shape corresponding to a plurality of the convex connectors 12 and accordingly required resin injection portions 64.

Figure 8:
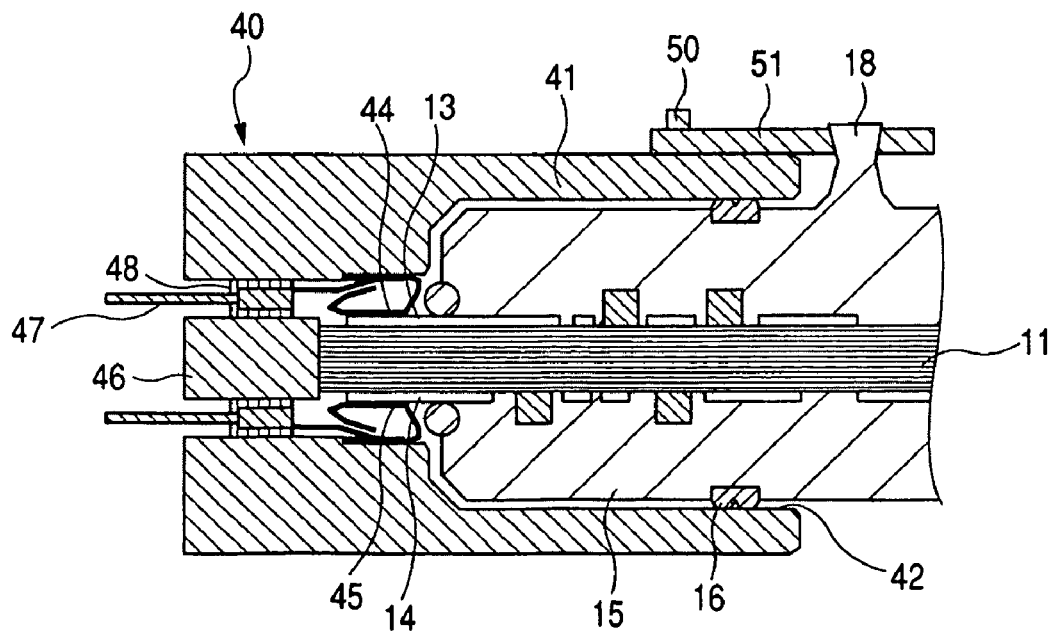
FIG. 8 is a drawing illustrating a second example of an electronic circuit device according to the present invention.

FIG. 8 illustrates a second example of an electronic circuit device of the present invention. In this example, a projection 18 is provided on the outer surface of the resin-molded portion 15 of the electronic circuit device 10. The housing 41 of a concave connector 40 is provided with a pivot 50 and a lever 51. The convex connector 12 of the electronic circuit device 10 is inserted into the concave portion of the housing of the concave connector 40. Thereafter, the lever 51 is pivoted about the pivot 50 to engage it with the projection 18. As a result, the convex connector 12 of the electronic circuit device 10 is locked on the concave connector 40 with reliability.

In this example, when the projection 18 on the electronic circuit device is engaged with the lever 51 of the concave connector 40, the electronic circuit device 10 is prevented from being displaced in the axial direction. Therefore, the electronic circuit device 10 is prevented from coming off. In addition, the convex connector 12 need not be abutted against the receiving member 46 of the concave connector 40. Therefore, the convex connector 12 does not receive strong pressing force from the receiving member 46. Furthermore, the electronic circuit device 10 is prevented from wobbling to the left and right. This prevents wear and breakage due to pinching force, vibration, or the like that are likely to occur in the following areas: the area of contact between the metal terminals 13 and 14 for connection of the convex connector 12 and the metal terminals 44 and 45 for connection of the concave connector 40; and the area of connection between the sealing member 16 and the housing of the concave connector 40.

In the example in FIG. 8, one lever 51 is provided. Instead, a lever may be provided in two places on the upper and lower sides or on the left and right sides.

The projection 18 may be formed of the same material as that of the resin-molded portion 15 as part of the resin-molded portion 15. More specific description will be given. The molds are provided with concave portion corresponding to the outside shape of the projection 18. Thus, the projection can be formed simultaneously with the resin-molded portion 15. If the resin-molded portion 15 is formed of a material, such as epoxy resin, weak against shear stress, the sectional area of the projection may be increased. Or, a metal piece may be resin-molded therein.

Figure 9:
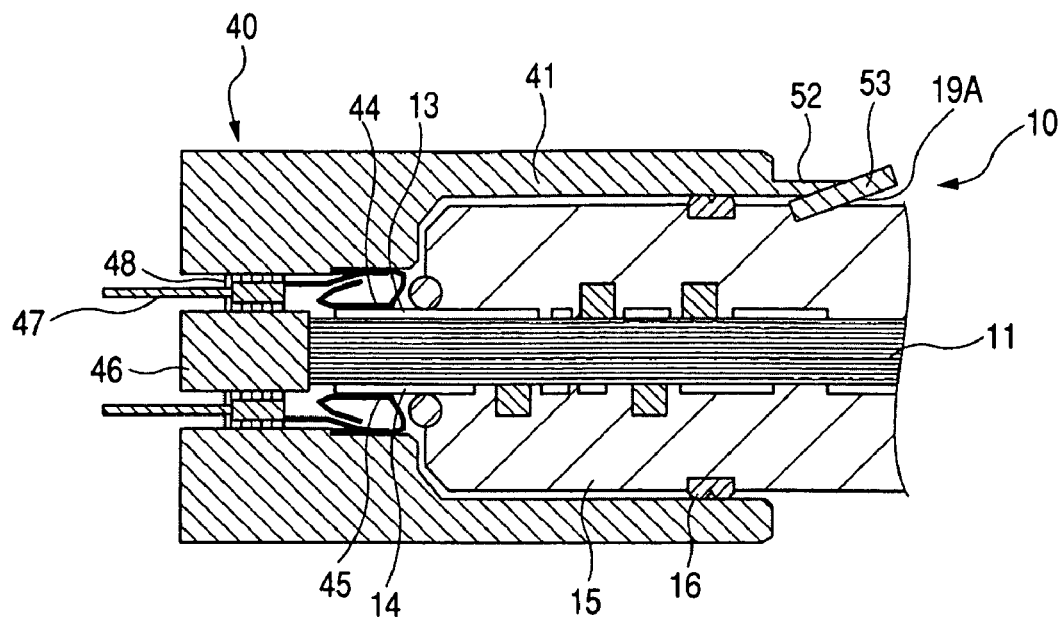
FIG. 9 is a drawing illustrating a third example of the electronic circuit device according to the present invention.

FIG. 9 illustrates a third example of an electronic circuit device of the present invention. In this example, a recess 19A is formed in the outer surface of the resin-molded portion 15 of the electronic circuit device 10. The housing 41 of a concave connector 40 is provided with a protruded plate 52, and a hook 53 is provided at its end. When the convex connector 12 of the electronic circuit device 10 is inserted into the concave portion of the housing of the concave connector 40, the hook 53 is engaged with the recess 19A. As a result, the convex connector 12 of the electronic circuit device is locked in the concave connector 40 with reliability. To remove the convex connector 12 from the concave connector 40, one end of the hook 53 only has to be pushed. The other end of the hook 53 is moved by the principle of leverage in the opposite direction to the direction in which the hook 53 is pushed, and it goes out of the recess 19A.

In the example in FIG. 9, one hook 53 is provided. Instead, a hook may be provided in two places on the upper and lower sides or on the left and right sides.

In this example, when the electronic circuit device 10 is inserted into the concave connector 40, the hook 53 is automatically engaged with the recess 19A. Therefore, the following advantage is brought: a human error that can occur in the example illustrated in FIG. 8 involving use of a lever 51, that is, forgetting about fixing the circuit board device is prevented.

In this example, the hook 53 is abutted against the recess 19A in the resin-molded portion 15. Therefore, while pressing force is applied to the recess 19A in the resin-molded portion, shear stress is not exerted. Unlike the second example in FIG. 8, therefore, it is unnecessary to provide a metal piece or the like in the hook so that it can withstand shear stress. The material of the resin-molded portion 15 and the hook 53 of the concave connector 40 can be selected from among a wide range of materials.

Figure 10:
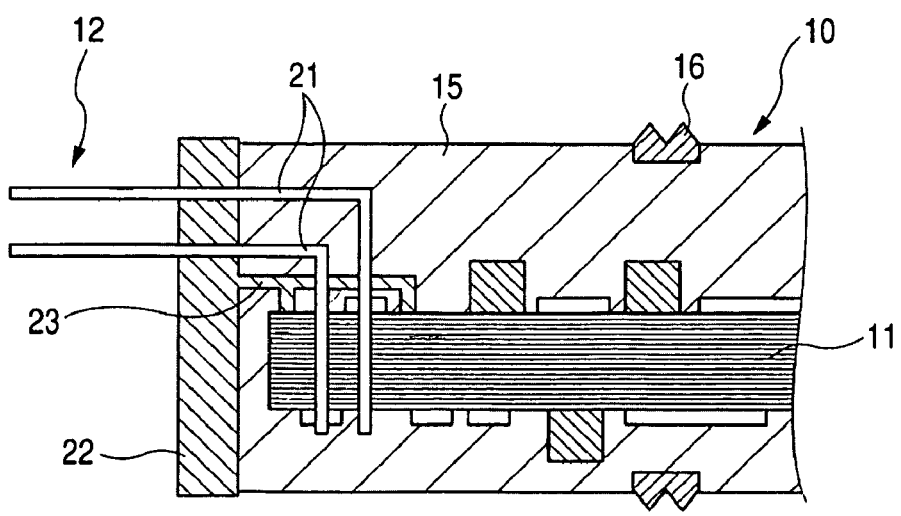
FIG. 10 is a drawing illustrating a fourth example of the electronic circuit device according to the present invention.

FIG. 10 illustrates a fourth example of an electronic circuit device of the present invention. In this example, the convex connector 12 of the electronic circuit device 10 includes metal pins 21. The metal pins 21 are substantially in L shape, and one end of them are protruded from the electronic circuit device 10 and form metal terminals for connection. The other ends are inserted into holes in the circuit board 11 so that they penetrate the circuit board. In this example, therefore, the metal terminals for connection are disposed on one side plane of the electronic circuit device 10 including the circuit board 11.

In the first example illustrated in FIG. 1, part of the circuit board 11 is exposed from the resin-molded portion 15. In this example, meanwhile, the whole of the circuit board 11 is covered with the resin-molded portion 15. A holding plate 22 is attached to an end of the resin-molded portion 15, and the holding plate 22 is connected with an aligning plate 23. The aligning plate 23 has convex portions, and the ends of the convex portions are abutted against the front face of the circuit board 11. The metal pins 21 penetrate the holding plate 22, and they are thereby supported and fixed.

In the example in FIG. 10, two metal pins 21 are provided. Instead, one metal pin may be provided, or three or more metal pins may be provided.

If a plurality of metal pins 21 are provided, they can be disposed in a line in parallel with the end face of the circuit board 11. Instead, they may be disposed in two or more lines.

Description will be given to a production method for the electronic circuit device in this example. First, the holding plate 22 provided with the metal pins 21 and aligning plate 23 is prepared. The aligning plate 23 may be formed integrally with the holding plate 22, that is, the aligning plate may be formed of the same material as that of the holding plate. The metal pins 21 may be formed integrally with the holding plate 22 by insert molding. Instead, the following method may be adopted: holes are formed in the holding plate 22 and the aligning plate 23, and the metal pins are inserted and fixed therein. Next, the circuit board 11 and the holding plate 22 are assembled together. The metal pins 21 are inserted into the holes in the circuit board 11, and the end of the aligning plate 23 is abutted against the front face of the circuit board 11. The metal pins 21 and the wires on the circuit board 11 are connected together by soldering. Thus, the holding plate 22 having the metal pins 21 is assembled to the circuit board 11.

The aligning plate 23 is provided with a function of positioning the holding plate 22 relative to the circuit board 11. The accuracy of positioning the metal pins 21 in the circuit board 11 can be enhanced by this function.

The thus obtained assembly is sandwiched between two molds, and the cavity formed between the molds is filled with resin. In this example, it is unnecessary to use the O-ring used in the example illustrated in FIG. 1.

Figure 11:
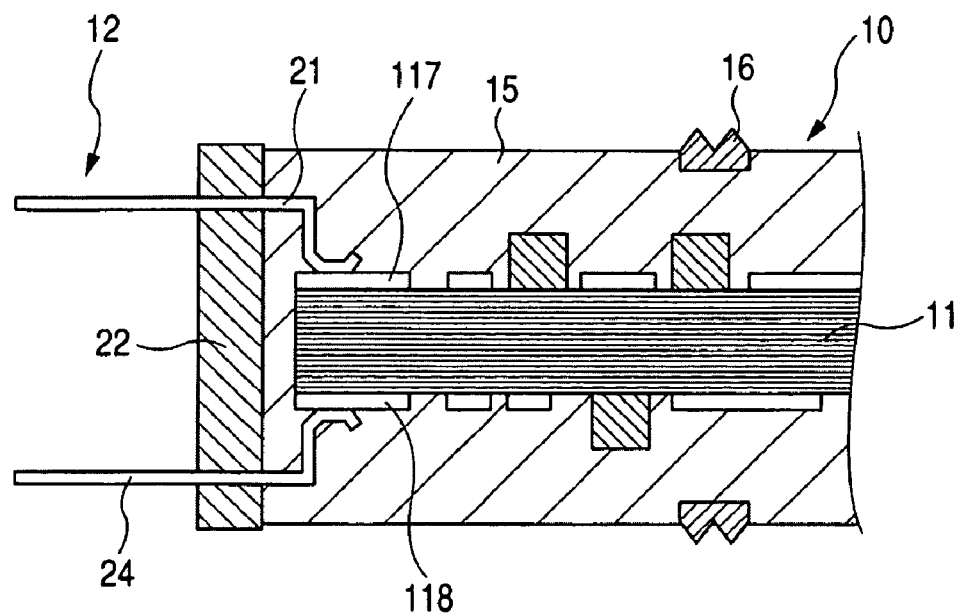
FIG. 11 is a drawing illustrating a fifth example of the electronic circuit device according to the present invention.

FIG. 11 illustrates a fifth example of an electronic circuit device of the present invention. In this example, the convex connector 12 of the electronic circuit device includes metal pins 24. The metal pins 24 are substantially in L shape, and one ends of them are protruded from the electronic circuit device and form metal terminals for connection. The other ends are bent into L shape, and connected to the metal wirings 117 and 118 on the surfaces of the circuit board 11. That is, the inner ends of the metal pins 24 are face-mounted on the circuit board 11. In this example, the metal terminals for connection are symmetrically disposed on the side plane of the electronic circuit device 10 including the circuit board 11.

Description will be given to a production method for the electronic circuit device in this example. First, the holding plate 22 provided with the metal pins 24 is prepared. The metal pins 24 may be formed integrally with the holding plate 22 by insert molding. Instead, the following method may be adopted: holes are formed in the holding plate 22, and the metal pins are inserted and fixed therein. Next, the circuit board 11 and the holding plate 22 are assembled together. The end of the circuit board 11 is inserted into between the inner ends of the two metal pins 24. The metal pins 24 and the metal wirings 117 and 118 on the circuit board 11 are connected together by soldering. Since the inner ends of the metal pins 24 are pressed against the circuit board 11 by spring force from the metal pins 24, soldering of the metal pins 24 may be omitted. Thus, the holding plate 22 having the metal pins is assembled.

Subsequently, the thus obtained assembly is sandwiched between two molds, and the cavity formed between the molds is filled with resin. In this example, it is unnecessary to use the O-ring used in the example illustrated in FIG. 1.

In this example, the circuit board 11 is sandwiched between the inner ends of the metal pins positioned on both sides. Therefore, an even number of metal pins are provided. In this example, it is unnecessary to use the aligning plate in the example illustrated in FIG. 10.

Figure 12:
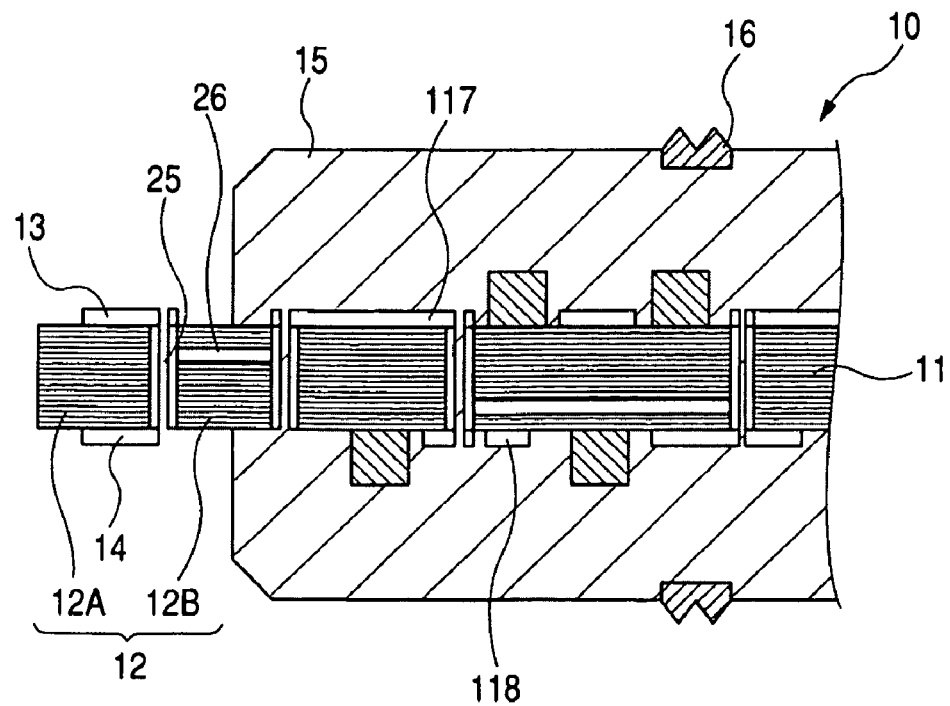
FIG. 12 is an enlarged sectional view of an end of a sixth example of the electronic circuit device according to the present invention.
Figure 13:
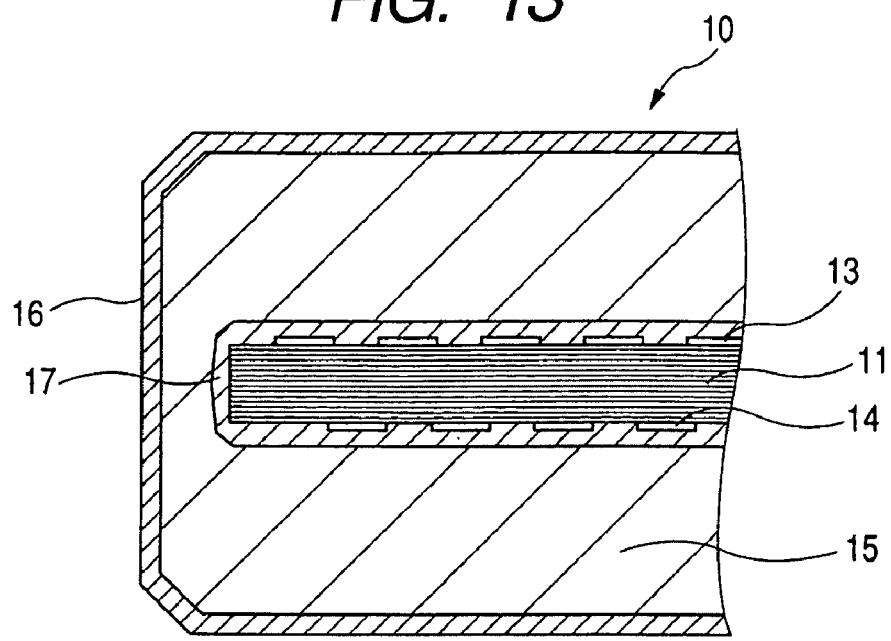

Description will be given to a sixth example of an electronic circuit device of the present invention with reference to FIG. 12 and FIG. 13. FIG. 12 is an enlarged sectional view of an end of the electronic circuit device in this example. FIG. 13 is an enlarged sectional view of the electronic circuit device in this example as a front view.

As in the first example in FIG. 1, the convex connector 12 of the electronic circuit device in this example is formed by extending the circuit board 11. The circuit board 11 usually has a laminated structure comprising a plurality of layers, and metal wirings are formed not only on the surfaces but also in internal layers of the board. A plurality of these metal wirings formed in different layers are electrically connected together through holes 25.

In this example, metal terminals 13 and 14 for connection are formed on the outer surface of the convex connector 12 at the end 12A of the convex connector 12. Meanwhile, the metal terminals 13 and 14 for connection are formed in internal layers 26 of the convex connector 12 at the root portion 12B of the convex connector 12. The metal terminals 13 and 14 for connection at the end 12A of the convex connector 12 are electrically connected with the metal terminals 13 and 14 for connection at the root portion 12B through the through holes 25.

Description will be given to a resin molding method for the electronic circuit device in this example. The circuit board 11 mounted with electronic components is sandwiched between two molds. The ends of the molds sandwich the base portion 12B of the convex connector 12 from both sides. At the base portion 12B of the convex connector 12, the metal terminals for connection are formed in internal layers. Therefore, if the ends of the molds are brought into contact with the outer surface of the convex connector 12, the metal terminals for connection are not damaged or broken. In this example, it is unnecessary to use the O-ring used in the example illustrated in FIG. 1.

It is preferable that the area of contact between the molds and the circuit board 11 should be widened as much as possible and the contact faces of the upper and lower molds should be symmetrically structured. Thus, stress exerted on the circuit board 11 is reduced. Further, even if there is warpage in the circuit board 11, pressing force can be uniformly applied so that the warpage will be eliminated.

Thermosetting resin is poured into the cavity formed between the two molds. The cavity has a shape corresponding to the outside shape of the resin-molded portion. Therefore, it is unnecessary to provide the first portion 63A as illustrated in FIG. 6.

In considerable cases, only through holes 25 that penetrate the circuit board 11 are obtained from the viewpoint of cost and standardization. If through holes 25 are provided between the end 12A and the base portion 12B of the convex connector 12, a problem arises. The metal wirings 13 and 14 for connection on the upper face and the lower face of the end 12A of the convex connector 12 cannot be formed in symmetrical positions as in the example illustrated in FIG. 4.

As illustrated in FIG. 13, the metal wirings 13 and 14 for connection on the upper and lower faces of the end 12A of the convex connector 12 are identical in number with each other. However, they are disposed in a staggered configuration on the upper and lower faces. As a result, the following advantage is brought: when the convex connector 12 is engaged with the concave connector 40, the pressing forces applied to the upper face and lower face of the circuit board 11 through the metal terminals for connection become identical. As a result, production of bending stress in the circuit board 11 is avoided.

Figure 14:
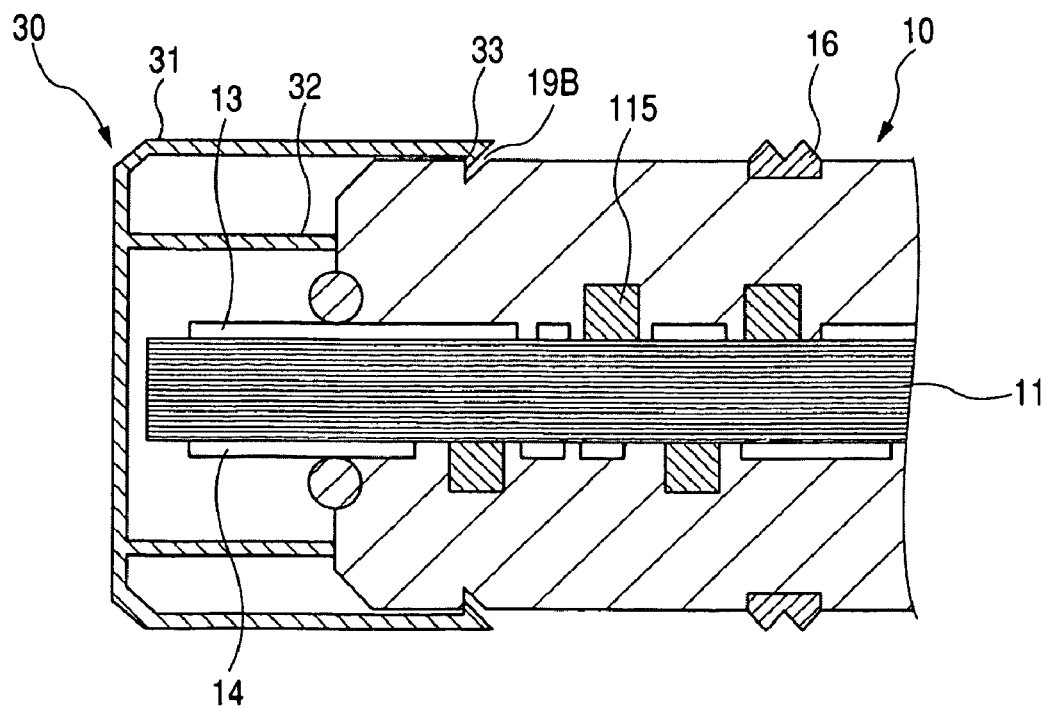
FIG. 14 is a drawing illustrating the convex connector of the electronic circuit device according to the present invention with a protective cover attached thereon.

FIG. 14 illustrates an electronic circuit device of the present invention with a protective cover 30 attached over the convex connector 12. The protective cover 30 comprises a frame member 31 and beam-like projections 32, and hooks 33 are provided at the ends of the frame member 31. Recesses 19B are formed in the outer surface of the resin-molded portion 15 of the electronic circuit device. When the convex connector 12 of the electronic circuit device 10 is inserted into the protective cover 30, the following takes place: the beam-like projections 32 are abutted against an end of the resin-molded portion 15, and the electronic circuit device 10 cannot be further pushed in. Thus, the end of the convex connector 12 is prevented from being abutted against the protective cover 30. At this time, the hooks 33 are engaged with the recesses 19B. As a result, the protective cover 30 is fixed on the electronic circuit device 10 with reliability. To remove the protective cover 30, the hooks 33 are bent outward, and then the protective cover 30 is pulled.

The protective cover 30 is used when the electronic circuit device 10 is transported and stored. It is unnecessary when the electronic circuit device 10 is actually installed in an automobile, a motorcycle, an agricultural machine, an industrial machine, a shipboard machine, or the like. Therefore, the protective cover 30 does not need such a high reliability as the electronic circuit device 10 needs. It may be formed of PET used for beverages and the like or an inexpensive material corresponding thereto. However, an appropriate material must be selected so that the attached protective cover 30 will not come off from the electronic circuit device 10 due to moisture absorption, thermal deformation, or the like.

Figure 15:
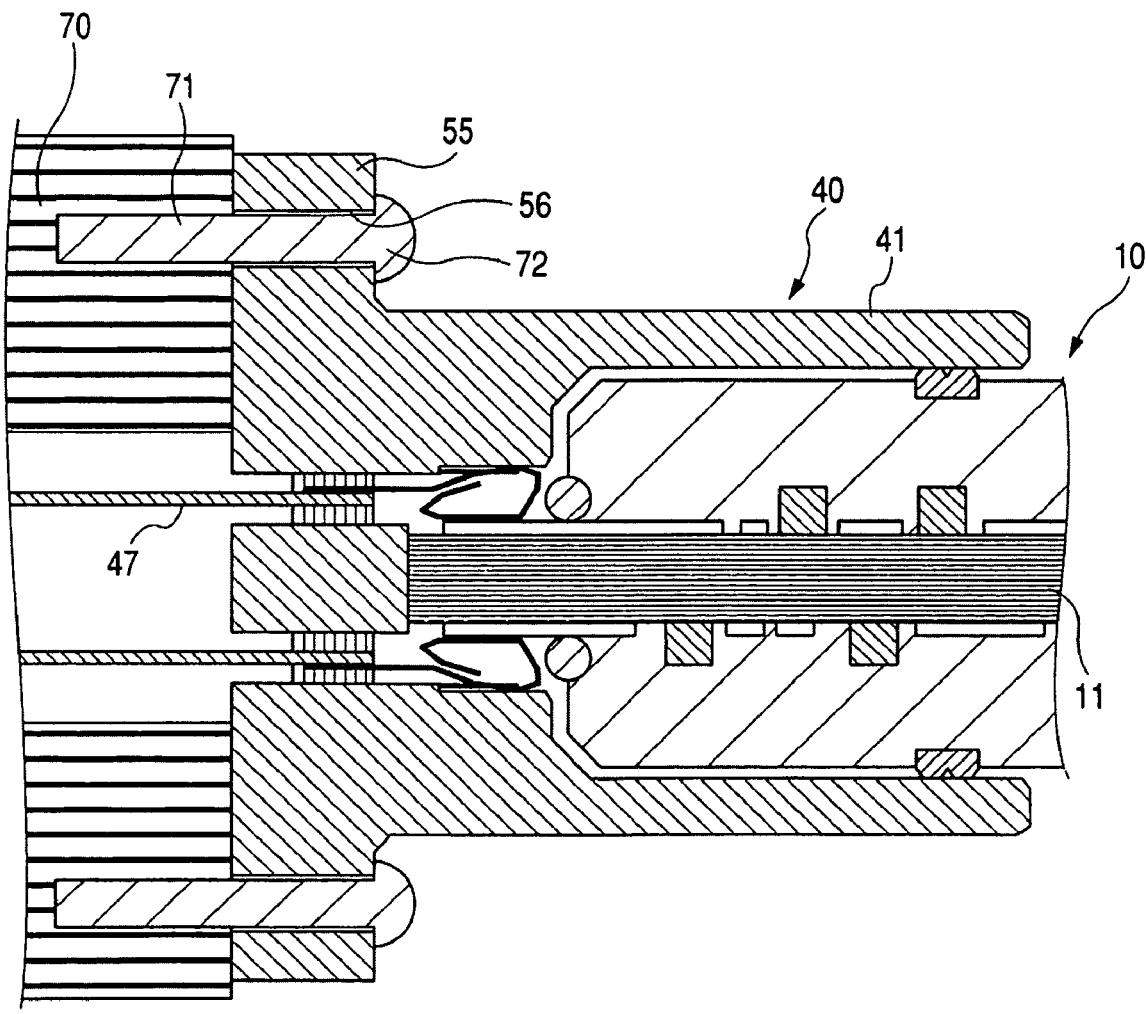
FIG. 15 a drawing illustrating the construction of a concave connector used for the electronic circuit device according to the present invention.

FIG. 15 illustrates an example of the construction of a concave connector 40 used for the electronic circuit device of the present invention. The housing 41 of the concave connector 40 has an attaching portion 55, and the attaching portion 55 is provided with holes 56. When this concave connector 40 is attached to a structure 70, such as automobile, motorcycle, agricultural machine, industrial machine, shipboard machine, or the like, the following procedure can be taken: screw holes 71 are formed in the structure 70, and screws 72 are engaged with the screw holes 71 in the structure 70 through the holes 56.

In addition to the method in which the screws 72 are used, various methods can be used to attach and fix the concave connector 40 to the structure 70. However, the method in which the screws 72 are used is preferable in terms of reliability and cost.

With the method in this example, the electronic circuit device 10 and the concave connector 40 are fixed as a single-piece construction on the structure 70. The resonance frequency of the single-piece construction comprising the electronic circuit device 10 and the concave connector 40 is lower than the resonance frequency of the electronic circuit device 10. When it is actually used, therefore, there is the possibility that vibration equivalent to the resonance frequency is applied. In such a case, the electronic circuit device 10 or the concave connector 40 is provided with a beam structure, the thickness is increased and the length is reduced, or the like measures are taken. Thus, the resonance frequency is increased, and a construction resistant to stress due to vibration can be obtained.

By providing resistance to vibration as mentioned above, it is made possible to install the electronic circuit device 10 and the concave connector 40 in this example on a structure, such as automobile, motorcycle, agricultural machine, industrial machine, shipboard machine, or the like. As a result, installation workability and maintenance workability can be enhanced.

Figure 16:
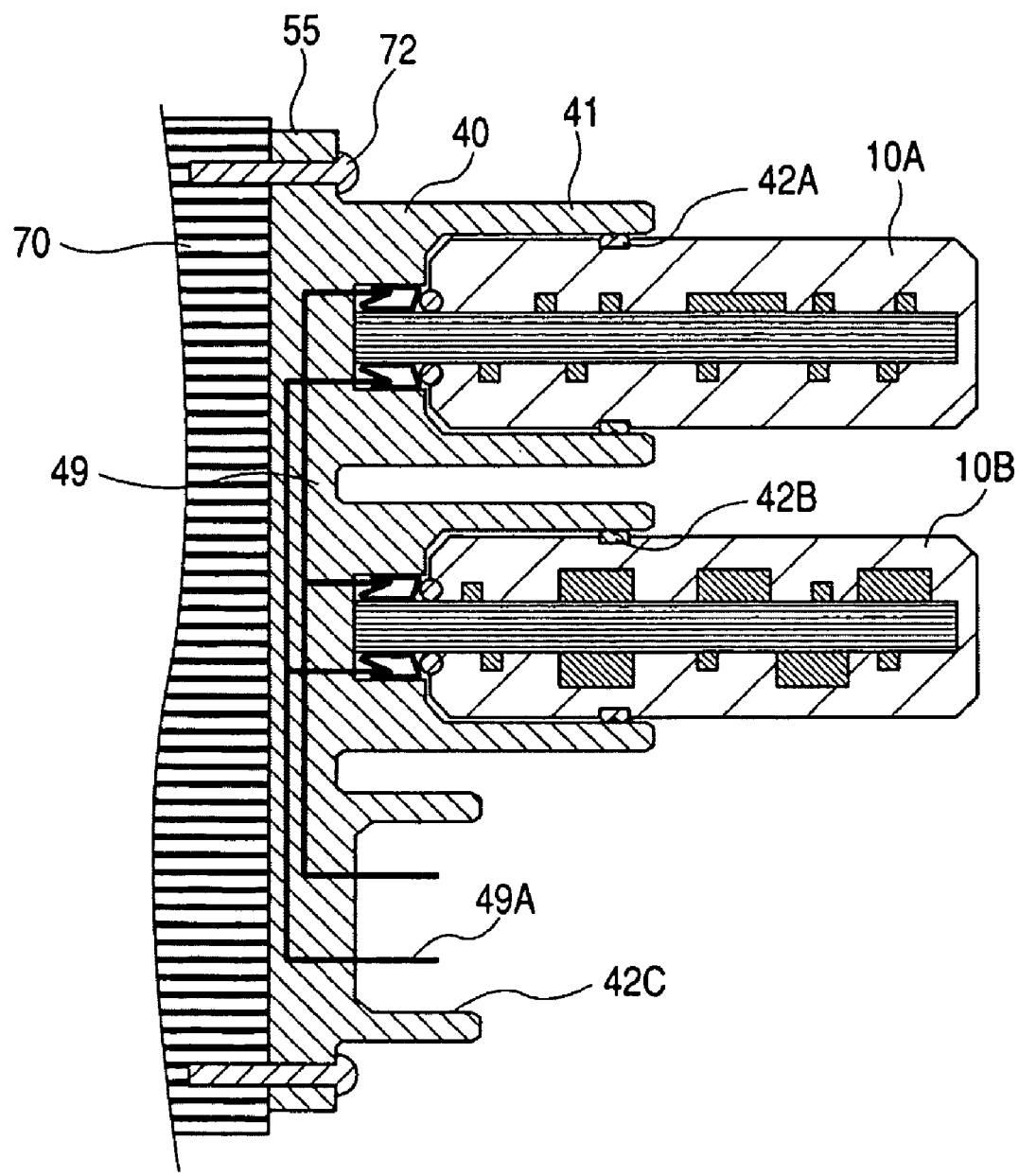
FIG. 16 is a drawing illustrating the construction of another example of a concave connector used for an electronic circuit device according to the present invention.

FIG. 16 illustrates the construction of another example of a concave connector 40 used for the electronic circuit device of the present invention. The concave connector 40 in this example has three concave portions 42A, 42B, and 42C formed in its housing 41. The first and second concave portions 42A and 42B may be identical in structure with the concave portion 42 of the concave connector 40 illustrated in FIG. 5. Metal wirings 49 are provided in the housing 41. One ends of the metal wirings 49 are connected with the metal terminals for connection disposed on the bottom of the first and second concave portions 42A and 42B. The other ends are connected with the terminals 49A protruded on the bottom of the third concave portion 42C. The terminals of the third concave portion 42C form convex connectors.

To install the concave connector in this example in a structure 70, such as automobile, motorcycle, agricultural machine, industrial machine, shipboard machine, or the like, screws 72 are used as in the example in FIG. 15. The example illustrated in FIG. 16 is provided with two concave portions, that is, slots so that two electronic circuit devices can be attached thereto. Instead, two or more slots may be provided like PCI slots in personal computers.

A plurality of electronic circuit devices 10A and 10B can be attached to the concave connector in this example. Therefore, if this is used for, for example, a controller, waste associated with the structure of the controller can be reduced. The heat radiation structure and noise resistance can also be improved by the following measure, for example: the first electronic circuit device 10A is mounted with computing function elements with a microcomputer at the nucleus; and the second electronic circuit device 10B is mounted with semiconductor devices, such as FET, for controlling large currents.

With the concave connector in this example, functions provided for the following can be easily changed by replacing the electronic circuit devices 10A and 10B: automobiles, motorcycles, agricultural machines, industrial machines, shipboard machines, or the like. A case where the concave connector in this example is mounted on an engine will be taken as an example. Where the same engine is mounted in different types of vehicles, electronic circuit devices 10A and 10B having different control circuits are prepared. Different functions can be provided by installing different electronic circuit devices from vehicle type to vehicle type.

In addition, if the necessity for enhancing the functions of a control circuit arises in the future, that can be coped with by replacing only the required electronic circuit devices as needed. If a problem arises with respect to the functions of a specific control circuit, it can also be solved by taking the same measure.

The metal wirings 49 of the concave connector can also be provided with a desired control circuit, an arithmetic circuit, or the like. In this case, it is possible to replace only the concave connector without changing the electronic circuit devices 10A and 10B. A case where the concave connector in this example is mounted on an engine will be taken as an example. Where the same engine is mounted in different types of vehicles, the same electronic circuit devices 10A and 10B are prepared, and concave connectors having different control circuits are prepared. Different functions can be provided by installing different concave connectors from vehicle type to vehicle type.

The electronic circuit device and concave connector according to the present invention can be used for automobiles, motorcycles, agricultural machines, industrial machines, shipboard machines, and the like. Where the present invention is used for an automobile, it is applicable to control modules such as engine control module, motor control module, and automatic shift control module, and sensor modules such as pressure sensor module and air flow meter module. This makes it possible to easily attain the effects of the enhancement of productivity of these modules and reduction of their size and cost.

Further, the present invention is applicable to the following items: brake control module that provides active safety function expected to evolve in the future; control modules such as suspension control module, steering control module, air bag control module, and seat belt control module; measurement modules such as following distance measurement module; and communication modules for information exchange with the outside of the vehicle via radio waves for obtaining the functions of ITS and the like, such as cellular phone communication module, ETC communication module, GPS communication module, and VICS communication module. The electronic circuit device and concave connector according to the present invention is excellent in resistance to chemicals. This makes it possible to enhance the degree of freedom in mounting control modules for equipment utilizing chemical change, such as fuel battery control module and lithium ion battery charge/discharge control module.

Up to this point, description has been given to examples of the present invention. However, the present invention is not limited to the above-described examples, and it will be understood by those skilled in the art that various changes may be resorted to within the scope of the invention described in the claims.

What is claimed is:

1. A production method for an electronic circuit device having a circuit board with a surface upon which electronic components are mounted; a resin-molded portion formed of resin so constructed that the electronic components are covered therewith; a convex connector formed by an exposed portion of the resin-molded portion and provided with metal terminals so as to be connectable to a concave connector, comprising the steps of:

preparing a circuit board that has a convex connector at an end thereof with the metal terminals extending along at least one surface of the circuit board and the electronic components mounted on the surface thereof;

preparing two molds so as to form a cavity comprising a first portion corresponding to the outside shape of the resin-molded portion and a second portion in which the convex connector is disposed;

sandwiching the circuit board between the two molds; and injecting resin into the cavity through a resin injection portion formed between the two molds; and wrapping an elastic sealing member around and at a position on the resin-molded portion to press against a wall of a concave portion of the concave connector for sealing the metal terminals and minimize transmission of undesirable force or vibration to the metal terminals.

2. The production method for the electronic circuit device according to claim 1, comprising the steps of:
   wrapping the O-ring around a base portion of the convex connector,
   wherein a clearance angle is formed in the inner wall of the second portion of the cavity with which the O-ring is in contact so that, when the circuit board is sandwiched between the two molds, the O-ring will not be caught between the edges of the two molds.

3. The production method for the electronic circuit device according to claim 1, wherein the metal terminal for connection is formed only at an end of the convex connector and the metal wiring connected with the metal terminal for connection are disposed in internal layers in the circuit board at a base portion of the convex connector.

4. The production method for the electronic circuit device according to claim 1, comprising the steps of:
   forming a projection on the inner surfaces of the molds throughout the inner circumferential surface;
   inserting the elastic sealing member to a groove made by the projection on the resin-molded portion.

5. The production method for the electronic circuit device according to claim 1, comprising the steps of:
   providing the convex connector at the end of the circuit board as an extension of the circuit board.

6. A production method for an electronic circuit device having a circuit board with a surface upon which electronic components are mounted; a resin-molded portion formed of resin so constructed that the electronic components are covered therewith; a convex connector formed by an exposed portion of the resin-molded portion and provided with metal terminals so as to be connectable to a concave connector, comprising the steps of:
   preparing a circuit board that has a convex connector at an end thereof and electronic components mounted on a surface thereof;
   providing the convex connector at an end of the circuit board as an extension of the circuit board;
   preparing two molds so as to form a cavity comprising a first portion corresponding to the outside shape of the resin-molded portion and a second portion in which the convex connector is disposed;
   sandwiching the circuit board between the two molds; and
   injecting resin into the cavity through a resin injection portion formed between the two molds;
   wrapping an elastic sealing member around and at a position on the resin-molded portion to press against a wall of a concave portion of the concave connector for sealing the metal terminals and minimize transmission of undesirable force or vibration to the metal terminals.

7. The production method for the electronic circuit device according to claim 6, wherein the metal terminals extend along at least one surface of the circuit board.

\* \* \* \* \*